United States Patent [19]

Drain

[11] Patent Number: 5,410,547

[45] Date of Patent: Apr. 25, 1995

[54] VIDEO CONTROLLER IC WITH BUILT-IN TEST CIRCUIT AND METHOD OF TESTING

[75] Inventor: Frederick L. Drain, Redwood City, Calif.

[73] Assignee: Cirrus Logic, Inc., Fremont, Calif.

[21] Appl. No.: 77,584

[22] Filed: Jun. 17, 1993

[51] Int. Cl.[6] ............................................. G06F 15/20
[52] U.S. Cl. .................................. 371/22.4; 324/73.1; 364/579; 364/580; 371/15.1; 371/22.6; 371/27
[58] Field of Search ............... 324/73.1; 364/579, 580; 371/15.1, 21.1, 22.4, 22.6, 25.1, 27

[56] References Cited

U.S. PATENT DOCUMENTS

| Re. 34,445 | 11/1993 | Hayes et al. | 371/21.1 |
|---|---|---|---|
| 2,996,666 | 8/1961 | Baker | 324/73.1 |
| 3,082,374 | 3/1963 | Buuck | 364/579 X |
| 3,487,304 | 12/1969 | Kennedy | 324/73.1 |
| 4,192,451 | 3/1980 | Swerling et al. | 371/22.4 |
| 4,194,113 | 3/1980 | Fulks et al. | 371/22.4 |
| 4,827,476 | 5/1989 | Garcia | 371/21.1 X |
| 4,835,458 | 5/1989 | Kim | 324/73.1 |
| 4,918,378 | 4/1990 | Katircioglu et al. | 365/201 |
| 5,006,787 | 4/1991 | Katircioglu et al. | 324/73.1 |
| 5,051,996 | 9/1991 | Bergeson et al. | 371/22.4 |
| 5,138,619 | 8/1992 | Fasang et al. | 371/21.1 |

OTHER PUBLICATIONS

Embedded Test Bus Eases ASIC Design and Testing, *Electronic Design*, May 3, 1993. Author, Dave Bursky.

Primary Examiner—Edward R. Cosimano
Attorney, Agent, or Firm—Lowe, Price, LeBlanc & Becker

[57] ABSTRACT

A video controller integrated circuit is provided with an on-chip test data generator within the integrated circuit for emulating an external memory for testing purposes. When activated, the test data generator generates a pseudo-random data stream which is fed to the data input of a video memory controller within the integrated circuit. A signature generator, also within the integrated circuit generates a characteristic signature from the data stream which is compared to a characteristic signature from a known good integrated circuit.

28 Claims, 9 Drawing Sheets

VIDEO CONTROLLER IC WITH BUILT-IN TEST CIRCUIT AND METHOD OF TESTING

TECHNICAL FIELD OF THE INVENTION

This invention relates generally to digital integrated circuits, and more particularly to methods and apparatus for high speed integrated circuit testing. The present invention has particular application to testing high speed video controller integrated circuits.

DESCRIPTION OF RELATED ART

In integrated circuit (IC) design and fabrication, it is necessary to test each IC to determine that it has been correctly fabricated. Some of these tests, for example, a test to assess IC pin drive strength, are appropriately conducted under static conditions. Such static tests can be satisfactorily performed with ordinary voltage or current meters. Other tests are appropriately conducted under dynamic, but not high speed, conditions. An example is verification that circuit connectivity and logic are correct. These tests can reasonably be conducted using ordinary automatic test equipment (ATE), such as a Hewlett-Packard Model 82000 operating at up to 70 Mhz.

Other tests can be meaningfully performed only at full operating speed, with normal operational inputs to the IC. These tests can require, or even exceed, the capabilities of the most capable and expensive of currently available ATE units.

One reason this problem can arise is due to the speed of the signals being tested. Any ATE has a maximum limit on the frequency at which it can change the inputs to an integrated circuit, and a maximum limit on the frequency at which it can sample the outputs of an integrated circuit. These limits can be due to the operating speed of the ATE's own circuits, or due to inevitable time delays introduced by the wiring from the ATE circuitry to the integrated circuit being tested. The wiring delay can become an acute problem when the integrated circuit signal being tested is a bi-directional pin, which can be either an input to or an output from the integrated circuit. In general, ATE which can test faster integrated circuits are more expensive, and thus add to the overall cost of manufacturing the integrated circuit.

Another reason this problem can arise is due to the asynchronous nature of normal input signals. In normal operation, the inputs to an integrated circuit can come from many different sources, with little or no synchronization of their arrival at the integrated circuit. By contrast, an ATE is typically designed to provide inputs to the integrated circuit in a predetermined pattern of synchronous time steps. More capable ATE allow integrated circuit inputs to be logically divided into a small number of groups which can then behave asynchronously from other groups, but still with the limitation that signals within each group will be synchronous with respect to one another. If the limitations of the ATE prevent the test pattern from accurately reflecting real operating conditions, the integrated circuit will not be adequately tested.

Yet another reason this problem can arise is due to the requirement that an input to the integrated circuit must sometimes be changed quickly in response to an output from another pin of the integrated circuit. Most ICs will be used in combination with other integrated circuits in a system. Frequently, an output from one integrated circuit will cause another integrated circuit in the system to change its output as well, which in turn may be an input to the first integrated circuit. To test this behavior, the ATE either must be fast enough to react to the integrated circuit output signal as the system would, or the test pattern must predict accurately when the integrated circuit output will change. Either of these options increases the speed, and therefore the cost, of the ATE.

Referring to FIG. 1 there is shown a portion of a system for employing a video controller IC 101 in an ISA-type computer system. The term "video controller" as applied herein is defined as, but not limited to, a video controller IC for use in a video graphics controller such as a CGA, EGA or VGA type controller or the like. In addition, the present invention has applications to other types of integrated circuits where high speed testing is desired.

The system includes a host ISA-type Bus 113 which acts as an interface between a host processor 150 and video controller 101. System address bus 108 and system control bus 106 allow the host processor 150 to write or read data on system data bus 105 to or from video controller IC 101. Some of the data written to video controller IC 101 from ISA-type bus 113 controls operating modes and characteristics of video controller IC 101; other data written to video controller IC 101 from ISA-type bus 113 is intended to be stored in external video memory 114.

To store system data into external video memory 114, video controller IC 101 uses video memory address bus 110 and video memory control bus 109 to define the destination location in the external video memory. The system data is provided to external video memory 114 on video memory data bus 111. Video memory address bus 110, video memory control bus 109 and video memory data bus 111 which are connected to IC 101 through nodes or terminals (not shown), may hereinafter be generally referred to as video memory busses 109, 110, 111.

Data in external video memory 114 may define an image to be displayed on video display 115. Video controller IC 101 uses video memory busses 109, 110, and 111 to read data from external video memory 114, process the data as required, and then transfer the data to video display 115 on analog video output 103. Video data are also output on video output data bus 104, which provide digital data analogous to the analog video signal output on video output 103. This digital data may be used, for example, for higher resolution display formats such as XGA or 8514.

Video controller IC 101 sends additional video control signals to video display 115 on video output control bus 102. The relative timing of signals from video memory busses 109, 110, 111 and video output signals sent over video output 103 and video output data bus 104 is controlled by clock signals generated internally to video controller IC and derived from clock signals sent over system reference clock line 107.

Referring to FIG. 2 the same video controller IC 101 is depicted in a manufacturing test environment connected to ATE 112. In order to test video controller IC 101, ATE 112 must mimic the behavior of the system elements shown in FIG. 1, namely, host bus 113, external video memory 114, and video display 115. ATE 112 must also use system address bus 108 and system control bus 106 to write or read data on system data bus 105 to or from video controller IC 101. The data written to video controller IC 101, which is intended to be stored in a video memory, must be observed by ATE 112 on video memory data bus 111. In addition, ATE 112 must observe that video memory address bus 110 and video memory control bus 109 behave correctly, as if a video memory were attached.

ATE 112 must also observe the signals on video output control bus 102, video output 103, and video output data bus 104. However, video output 103 and video output data bus 104 signals are derived from data which, in FIG. 1, was read from external video memory 114. Therefore, ATE 112 must observe video memory address bus 110 and video memory control bus 109 and itself put correct video data on video memory data bus 111 at the correct time. In order for ATE 112 to know the relative timing of signals on video memory buses 109, 110, 111 and signals on video output 103 and video output data bus 104, internally generated clock signals cannot be used. Instead, ATE 112 supplies external system clock signals over system clock line 107.

Referring to FIG. 3 there is shown an internal block diagram of video controller IC 101 incorporating a number of functional elements, shown in block diagram form, and residing on a common semiconductor substrate. These functional elements comprise a memory controller 116, graphics, CRT and attribute controllers 117, 119, 121, a CPU interface 120, video FIFO 118, clock synthesizer 122, video output 123 and signature generator 124.

System data written to the integrated circuit via system data bus 105, system control bus 106, and system address bus 108 (hereinafter generally referred to as system busses 105, 106, 108) connected to IC 101 through nodes or terminals (not shown), goes through CPU interface 120 to control the other elements of video controller IC 101 via internal data and control bus 125. Status and other data can also be read from the other elements in video controller IC 101 via internal data and control bus 125, CPU interface 120 and system busses 105, 106, 108.

Data written to video controller IC 101, intended to be stored in external video memory 114 shown in FIG. 1, is written through and modified as necessary by graphics controller 117, then written to memory controller 116. Memory controller 116 drives appropriate values on video memory control bus 109 and video memory address bus 110, and drives data out on video memory data bus 111.

Memory controller 116 is also responsible for reading memory data which is needed to define video data. Memory controller 116 drives appropriate values on video memory control bus 109 and video memory address bus 110, and receives video memory data on video memory data bus 111. The source of the video data may be either external video memory 114 as shown in FIG. 1, if video controller IC 101 is being used in a system environment, or ATE 112 as shown in FIG. 2, if video controller IC 101 is being used in a test environment.

In operation, video data from memory controller 116 passes through video FIFO 118, then is modified as necessary in attribute controller 121 before being output on video output data bus 104. Data on the video output data bus is further modified by video output block 123, and driven out on video output 103. Video output block 123 may comprise, for example, a RAMDAC (Random Access Memory Digital to Analog Converter). Video signals entering the RAMDAC may comprise, for example, data which describes a color to be displayed. This data may define a number of a color, but not necessarily the particular color itself. The RAM portion of the RAMDAC contains a lookup table which converts this number into a digital signal representing a color value. The contents of the lookup table can be altered by software such that a particular color value can be assigned to a different number (or vice versa). The DAC portion of the RAMDAC converts this color value to an analog output, for example, analog VGA or the like, which is then transmitted on video output 103.

CRT controller 119 generates the signals of video output control bus 102. Memory controller 116 uses one of the internal clocks 126. CRT controller 119, video FIFO 118, attribute controller 121, and video output 123 use a different, asynchronous one of internal clocks 126. Techniques known in the art are used to synchronize the transfer of data from memory controller 116 to video FIFO 118.

In normal operation, internal clocks 126 are generated by clock synthesizer 122, using system reference clock 107. In a test environment, clock synthesizer 122 is bypassed, and internal clocks 126 are driven directly by system clocks 107 from ATE 112, as shown in FIG. 2.

Signature generator 124 can be used for testing in either the test environment or in normal operation. Signature generator 124 takes as its inputs video output control bus 102, video output data bus 104, control information over internal data and control bus 125 from CPU interface 120, and the same asynchronous one of the internal clocks 126 which was used by CRT controller 119, video FIFO 118, attribute controller 121, and video output 123.

Using techniques known in the art, such as a cyclic redundancy check or the like, signature generator 124 creates from any combination of its inputs over time, a characteristic signature which can be read via internal data and control bus 125 and CPU interface 120 by either the host computer (not shown) in the system of FIG. 1, or ATE in the test environment of FIG. 2. A correct signature indicates that the correct control values were used by all elements of video controller IC 101, that the elements performed their tasks correctly, and that video memory data read on video memory data bus 111 was correct.

In a test environment, such as shown in FIG. 2, the ATE 112 feeds system commands to the video controller IC 101 via system busses 105, 106, 108 commanding video controller IC 101 to store or retrieve data from an external video memory. ATE 112 also acts to receive memory control and address commands from video controller IC 101 over video memory control bus 109 and video memory address bus 110, respectively. In response to these commands, ATE 112 transmits preselected video test data back to video controller IC 101 over video memory data bus 111. In this manner, ATE 112 emulates the external video memory 114 shown in FIG. 1.

ATE 112 tests the operation of video controller IC 101 with the aid of signature generator 124 shown in FIG. 3. Such signature generators are generally known in the art; however, usually, these signature generators are located externally to video controller IC 101. Signature generator 124 generates a first characteristic signature for a given data stream using a technique such as cyclic redundancy check (CRC) as discussed above. This first characteristic signature is then output to ATE 112 via internal data and control bus 125, CPU interface 120 and system data bus 105.

ATE 112 compares this first characteristic signature with a second characteristic signature stored in its internal memory (not shown). This second characteristic signature can be obtained by loading the characteristic signature from a video controller IC 101 which is known to be good, or by determining the characteristic signature using a mathematical algorithm or emulation within the ATE. Once the characteristic signature is determined for a particular stream of video memory data, this signature and data can be used again to test other video controller Ics 101.

If the first and second characteristic signatures match, the video controller IC 101 is presumed to be operating properly. If the signatures do not match, then the chip is bad. This particular test may be repeated a number of times using differing data streams and corresponding characteristic signatures.

As discussed above, there are three problems which can arise in testing an integrated circuit such as video controller IC 101. The first is speed. For example, video output control bus 102 and video output data bus 104 can operate much faster than the video memory busses 109, 110, 111, which in turn are much faster than the system busses 105, 106, 108.

The second problem is asynchronicity. For example, in an operating system, internal clocks 126 as used by memory controller 116 and the different, asynchronous one of the internal clocks used by CRT controller 119, video FIFO 118, attribute controller 121, and video output 123, are asynchronous with respect to one another and with respect to the system reference clock 107. Therefore, in an operating system, video output control bus 102 and video output data bus 104, video memory busses 109, 110, 111, and system busses 105, 106, 108 are asynchronous with respect to one another.

The third problem is accurately mimicking the behavior of other system elements. For example, ATE 112 of FIG. 2 must be able to interpret the values on video memory control bus 109 and video memory address bus 110 and must respond with the correct video data on video memory data bus 111.

The prior art solution to these three problems has been to test the integrated circuit at a slower speed, to force synchronicity, and to limit the behavior of the integrated circuit under test to those cases for which the response of ATE 112 of FIG. 2 can be easily predicted and predetermined. However, this has resulted in inadequate testing of the video controller IC 101. Even if a particular video controller IC 101 passes all of these tests, the manufacturer cannot provide adequate assurance to its customers that the video controller Ics 101 will operate properly in a system environment.

SUMMARY OF THE INVENTION

A memory controller integrated circuit, in accordance with the invention, comprises a bus system of input and output busses, and a memory controller for processing input signals from the bus system and generating memory control signals to control an external memory over the bus system in response to the input signals. A test data generator, coupled to the bus system and on the same semiconductor substrate as the controller, monitors the memory control signals from the memory controller and supplies signals emulating external memory data signals on the bus system. Preferably, the test data generator includes a pseudo-random data generator for generating a pseudo-random data stream and providing the pseudo-random data stream as the signals emulating memory data signals from an external memory on the bus system.

In accordance with a particular aspect of the invention, the bus system includes memory busses interfacing with an external memory for sending memory address signals, memory control signals and memory data and for receiving memory data, and output busses carrying data signals from the memory.

The controller further preferably comprises a signature generator coupled thereto and to the bus system for generating a characteristic signature in response to memory data and supplying the characteristic signature on the bus system. The signature generator generates a characteristic signature using a cyclic redundancy check, in the preferred embodiment.

The memory address signals may be provided as an input to the test data generator and are combined with data from the pseudo-random signal generator or supplant data from the pseudo-random signal generator.

In accordance with the preferred embodiment of the invention, the memory controller integrated circuit comprises a video memory controller circuit.

A method of testing a video controller integrated circuit, in accordance with another aspect of the invention, comprises generating, from an external piece of test equipment, a first characteristic signature for a predetermined stream of data. The characteristic signature is stored in a memory of the test equipment, and a signal from the test equipment is supplied to the video controller integrated circuit to cause the test data generator thereon to generate the predetermined stream of data and transmit the predetermined stream of data to the memory controller. The signature generator on the integrated circuit generates a second characteristic signature and supplies same to the external piece of test equipment. The first and second characteristic signatures are compared in the test equipment.

Accordingly, one object of the present invention is to enable a relatively low speed, inexpensive ATE to test an integrated circuit whose critical characteristics include high speed inputs and outputs.

A further object of the invention is to test an integrated circuit whose critical characteristics include the ability to respond to asynchronous inputs.

Another object is to test an integrated circuit whose critical characteristics include the ability to work in a system with other complex, high speed integrated circuits.

Still another object of the present invention is to generate, independent of ATE, input signals which respond to high speed output from the integrated circuit under test.

DETAILED DESCRIPTION OF THE PREFERRED EMBODIMENT OF THE PRESENT INVENTION

Figure 1:
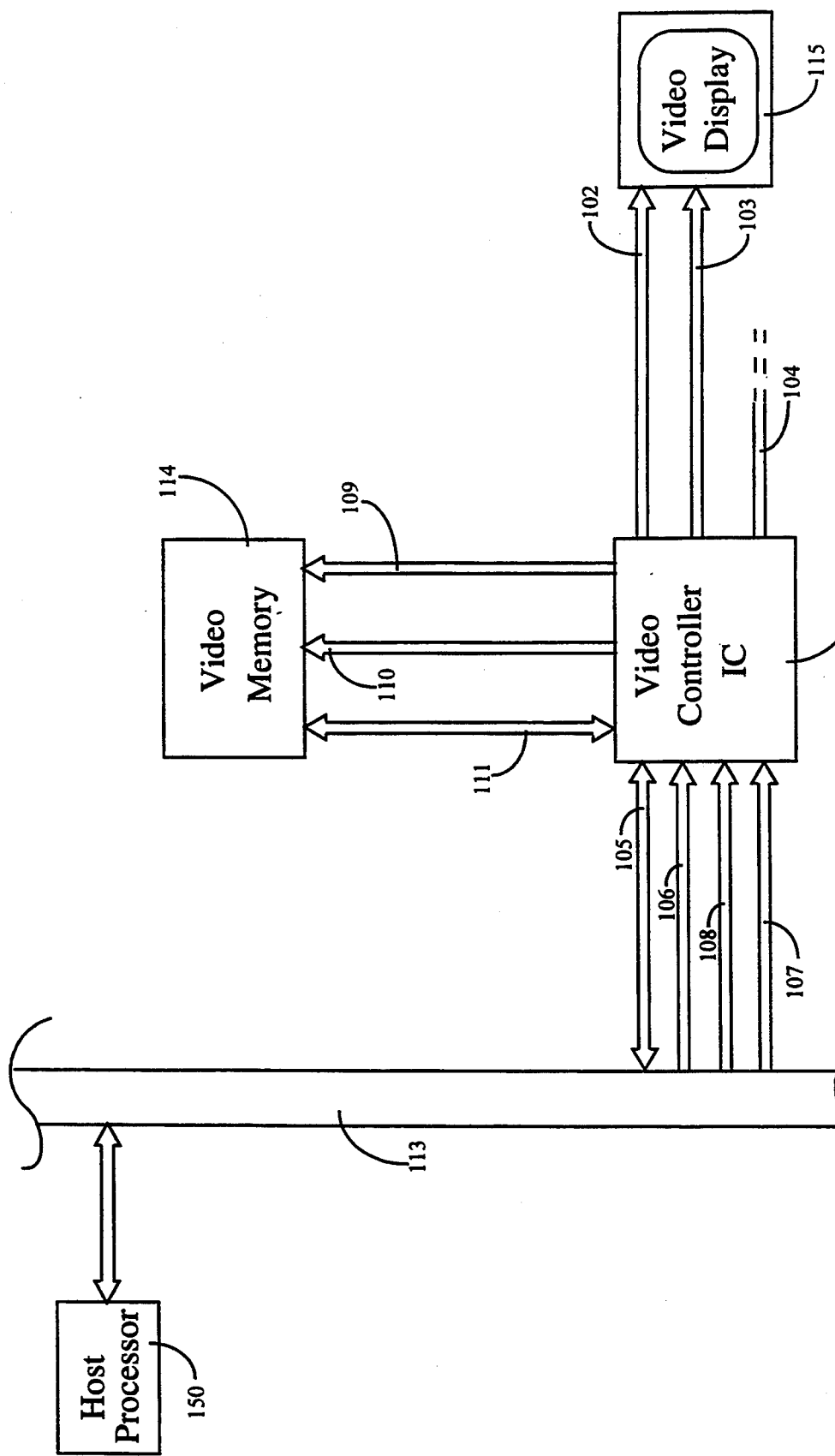
FIG. 1 Is a block diagram of a prior art video controller IC in a video subsystem, illustrating the normal system interaction between a video controller IC and other integrated circuits in the subsystem.
Figure 2:
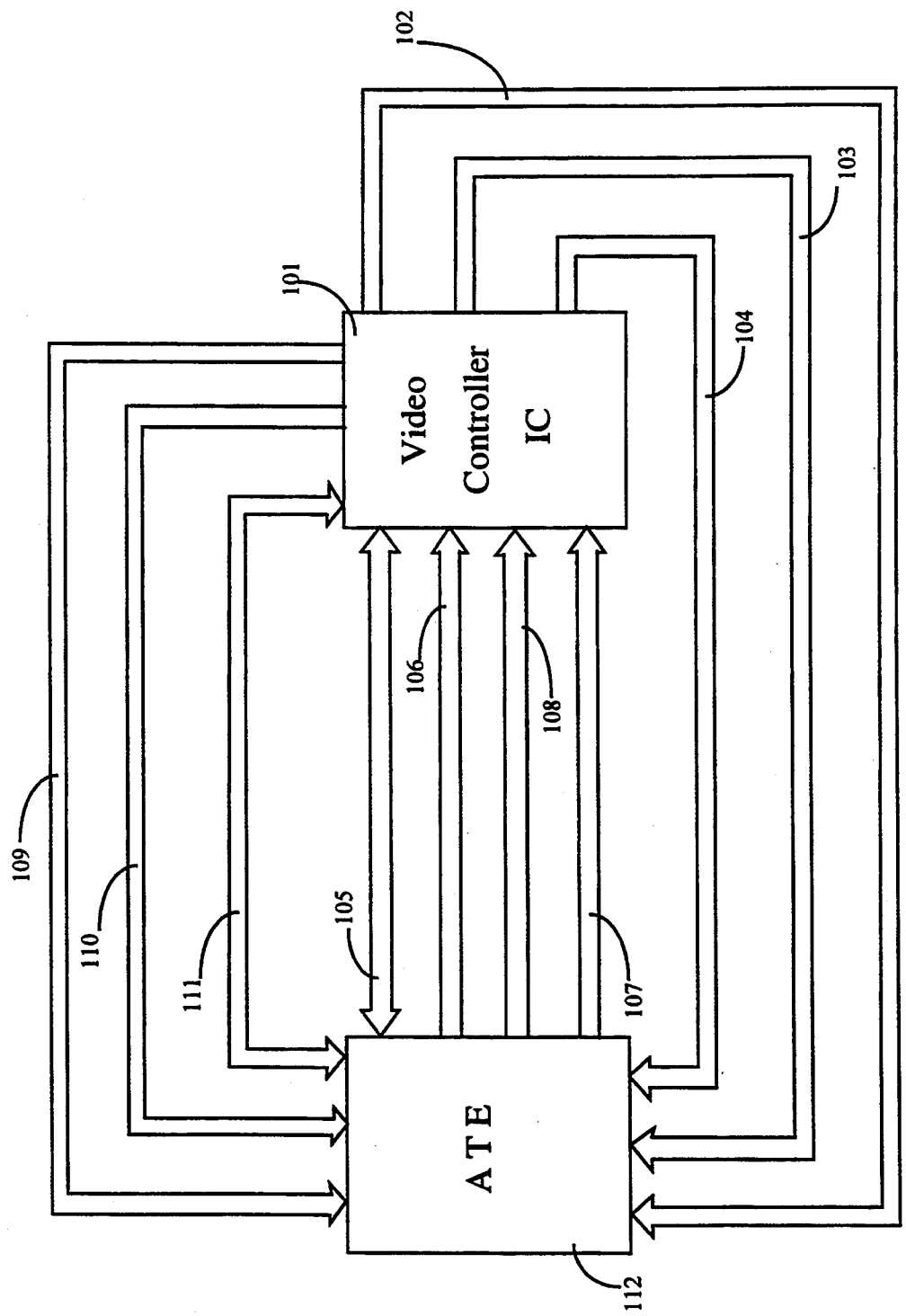
FIG. 2 is a block diagram illustrating one embodiment of a test environment in which the present invention can be employed.
Figure 3:
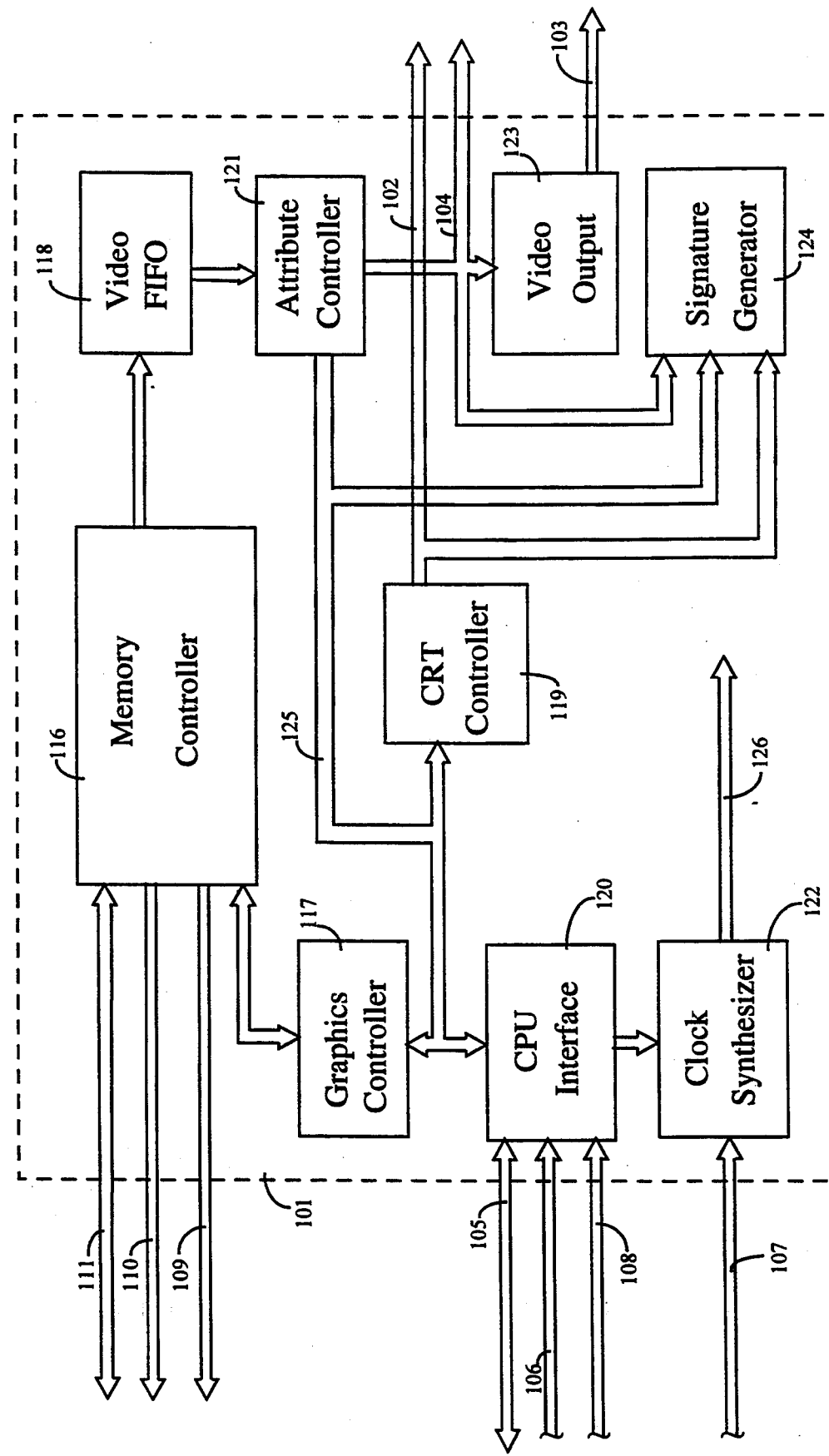
FIG. 3 is a block diagram of a video controller IC, illustrating the interacting functional blocks.
Figure 4:
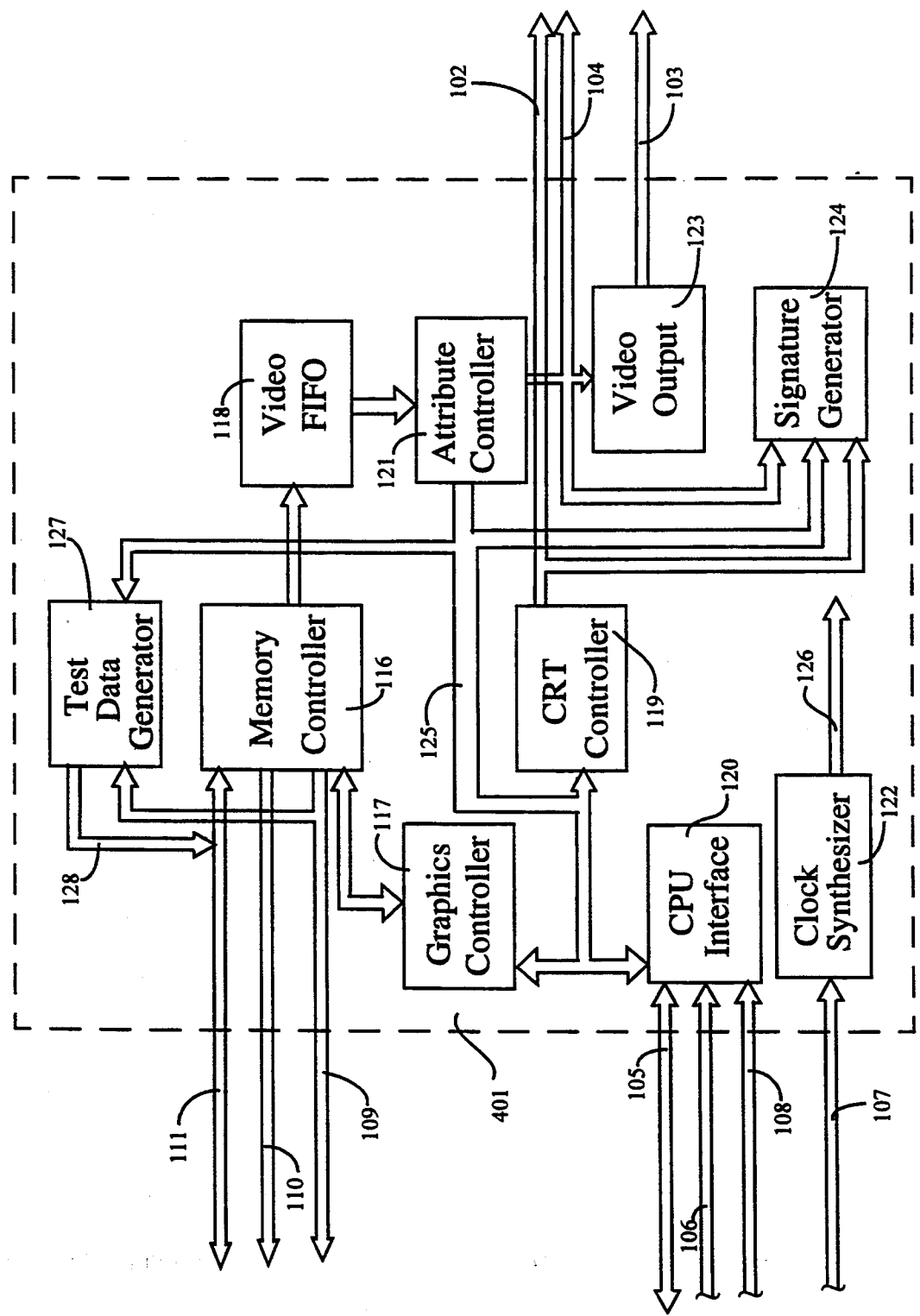
FIG. 4 is a block diagram of a video controller IC, including the present invention, illustrating the interaction of the preferred embodiment of the invention with the other functional blocks.

Referring to FIG. 4 there is shown an internal block diagram of video controller IC 401, fabricated on a single semiconductor substrate, and corresponding to video controller Ics 101 of FIGS. 1–3, but with the addition of a test data generator 127 on the same substrate in accordance with the preferred embodiment of the invention. Input and output signals 102–111 of video controller IC 401 correspond to the input and output signals 102–111 of video controller IC 101, described in connection with FIGS. 1–3. Internal elements 116–126 of video controller IC 401 correspond to internal elements 116–126 of video controller IC 101, described in connection with FIG. 3.

Test data generator 127 produces a repeatable stream of video memory data values, and when configured to operate, observes signals on video memory control bus 109. When memory controller 116 attempts to read video memory data on video memory data bus 111, test data generator 128 forces video data out via its own internal memory data bus 128 to the output portion of bidirectional video memory data bus 111. The video memory data then comes back into memory controller 116 on video memory data bus 111, and proceeds normally through video FIFO 118, attribute controller 121, and to signature generator 124. When test data generator 127 observes that a video memory read cycle is completed, it advances to the next datum in its repeatable stream of video memory data. Internal clocks 126 generated by clock synthesizer 122 are used at normal operating speed.

When video controller IC 401 is placed in the testing environment of FIG. 2, ATE 112 no longer need observe video memory busses 109–111, video output control bus 102 or video output data bus 104 in order to properly test video controller IC 101. Instead, test data generator 127 performs these functions and generates appropriate test data. Thus, speed and synchronicity problems, as well as response problems, are avoided. ATE 112 of FIG. 2 needs only to mimic the host computer by programming the correct control information via system busses 105, 106, 108 and CPU interface 120 and by providing a valid system reference clock 107. ATE 112 of FIG. 2 then waits for video controller IC 401 to generate a signature, reads the signature via CPU interface 120 through system busses 105, 106, 108 and compares the signature to a known correct value.

Figure 5:
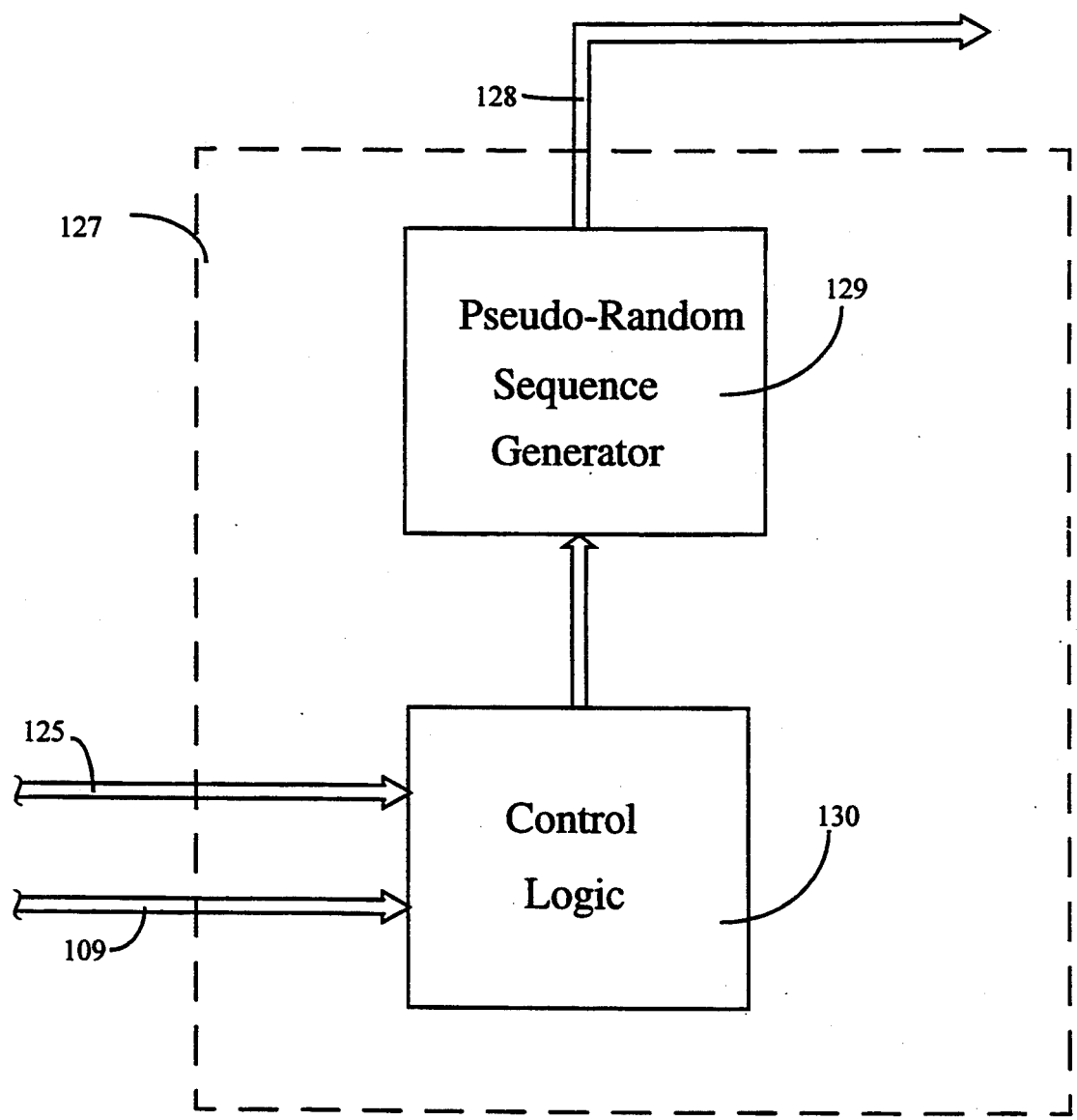
FIG. 5 shows a block diagram of the test data generator of the present invention.

Referring to FIG. 5, in the preferred embodiment test data generator 127 consists of a pseudo-random sequence generator (PRSG) 129 and control logic 130. Control logic 130 receives video memory control commands over video memory control bus 109 and internal data and control signals over internal data and control bus 125. In response to these inputs, control logic 130 drives pseudo-random sequence generator 129 which produces test video memory data in response to with the inputs to control logic 130.

Figure 8:
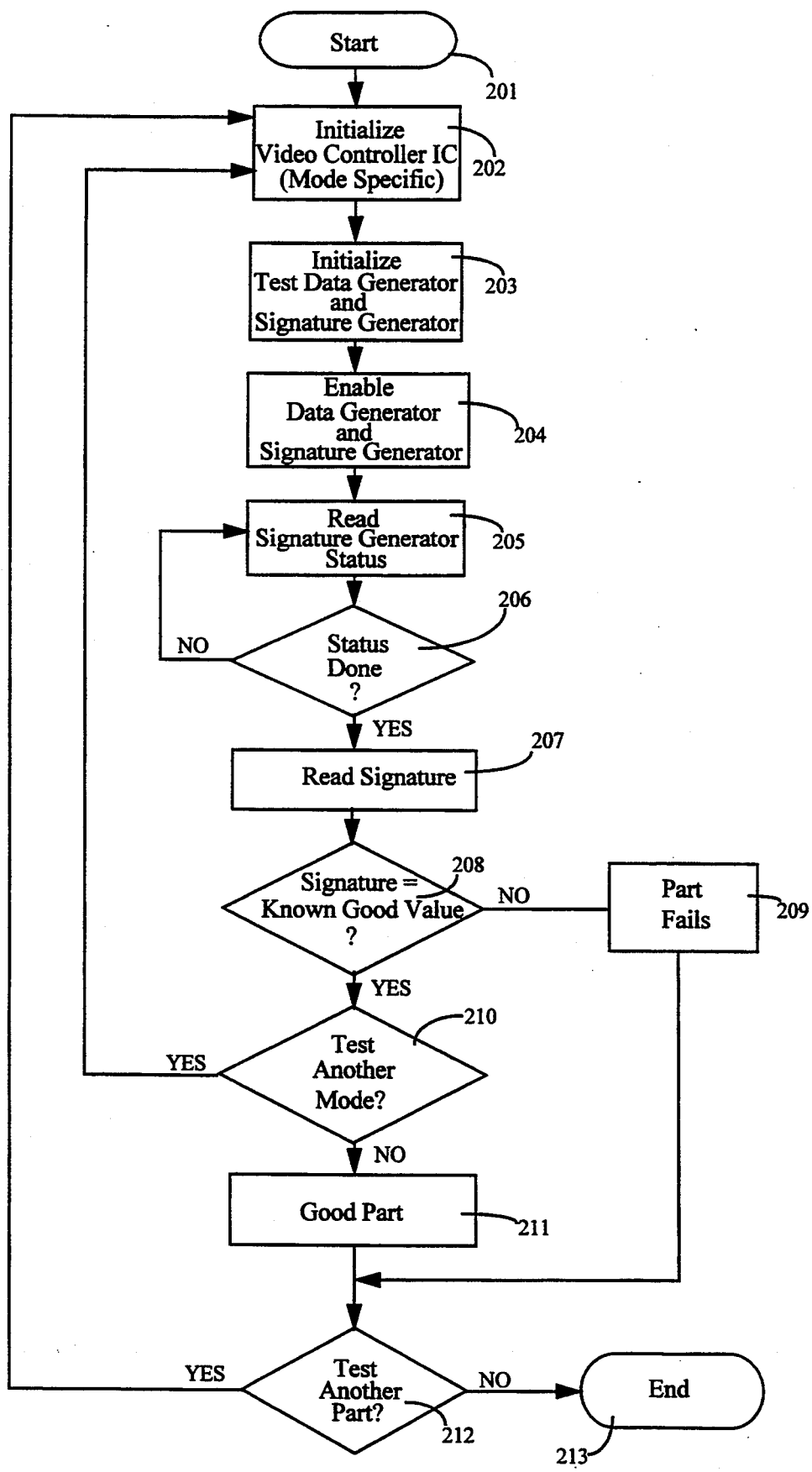
FIG. 8 shows a flow chart detailing the steps in testing the memory controller according to the present invention.

With reference to the flow chart of FIG. 8, in operation video controller IC 401 is connected to ATE 112 as shown in FIG. 2. The beginning of the test process is indicated in FIG. 8 by start step 201. In the first step 202 of the test procedure, ATE 112 initializes the video controller IC into a particular mode by transmitting appropriate commands over system busses 105, 106, 108. The particular mode chosen for testing may be selected from, for example, interleaved or noninterleaved video modes, graphics or text modes or other types of operating modes, such as different video formats (EGA, CGA, VGA or the like). Further, the mode selected may dictate the type of external memory that test data generator 127 will emulate during a test, as discussed below in conjunction with FIG. 6.

In step 203, test data generator 127 and signature generator 124 are initialized in response to commands from ATE 112. Both test data generator 127 and signature generator 124 are enabled as shown in step 204.

In step 205, the status of the signal generator 124 is read by ATE 112 over system busses 105, 106, 108. Generally, signature generator 124 will generate a characteristic signature for a stream of data comprising a video field for non-interlaced modes or even and odd fields for interlaced modes (i.e., one video frame). If the status of signature generator 124 indicates that signal generator 124 has completed processing a characteristic signature, as shown in step 206, then the characteristic signature will be read out over system busses 105, 106, 108 to ATE 112, as shown in step 207. Otherwise, processing returns to step 205.

In step 208, ATE 112 compares the signature read out in step 207 to a known good signature stored in the memory of ATE 112 as discussed above. If the read out signature does not match the stored signature, video controller IC 401 fails the test, as shown in step 209. If the signatures do match, then video controller IC 401 is presumed to be operating properly and control of the test procedure passes to step 210.

In step 210, it is determined whether to test another mode of operation of video controller IC 401. For example, in the first test, a non-interleaved video mode might be chosen. In a second iteration of the test procedure, the interleaved video mode might be chosen. If another test mode is selected, control of the test procedure passes to step 202 and the test is repeated as described above.

If no further modes are chosen for testing, control of the test procedure passes to step 211 and video controller IC 401 is determined to be operating properly. In step 212, it is determined whether another test is to be performed on another video controller IC 401. If no further parts are to be tested, the test sequence ends as shown in step 213. If another part is chosen, control of the test procedure passes to step 202 and the test begins again in the same manner as discussed above.

Figure 9:
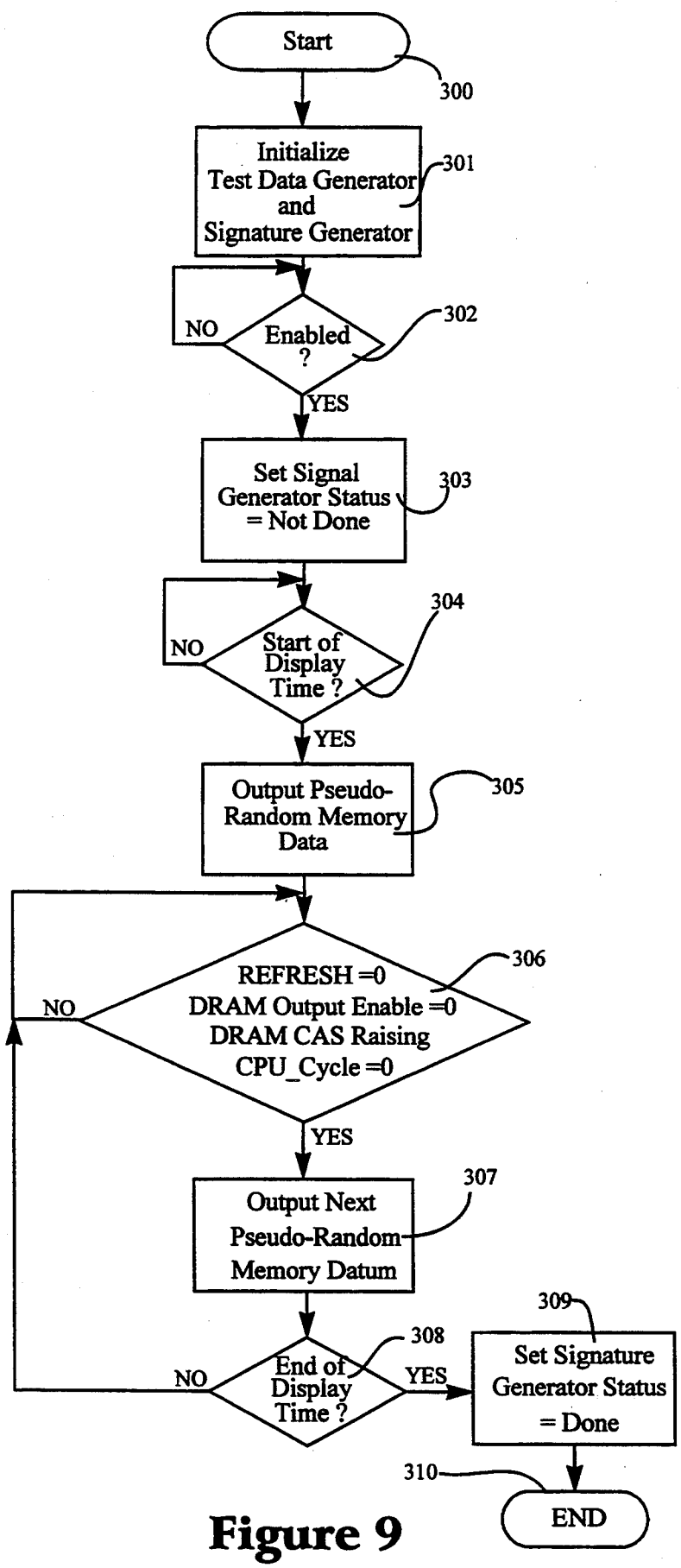
FIG. 9 shows a flow chart depicting the internal steps in the operation of the test data generator and signature generator of the present invention.

FIG. 9 shows the internal steps taken by test data generator 127 and signature generator 124 in testing video controller IC 401. After start step 300, test data generator 127 and signature generator are initialized in step 301 in a similar manner to step 202 of FIG. 8. In step 302, test data generator 127 determines whether generators 124 and 127 have been enabled. The enablement function of test data generator 127 will be described in more detail below in conjunction with FIG. 6. Once test data generator 127 and signature generator 124 have been enabled in step 302, the signature generator sets its status to "not done" as shown in step 303. This status is read by ATE 112 in step 205 of FIG. 8. Test data generator 127 then waits until display time starts by monitoring video memory control bus 109 as shown in step 304. Once display time commences, test data generator 127 outputs pseudo-random memory data in step 305 to video memory data bus 111.

In step 306, test data generator 127 then checks four conditions, which will be discussed below in conjunction with FIG. 6. If the external memory is in the REFRESH mode, or if an external computer is attempting to access video memory, for example, then control logic 130 of test data generator 127 will disable pseudo-random signature generator 129. If these conditions are met, the process advances to step 307 and the next pseudo-random memory datum is read out from test data generator 127 to video data memory bus 111. Processing will not continue until these conditions are met, as shown by the NO arrow in step 306.

Step 308 determines whether the display time has ended. As noted above, this display time is usually one video field for non-interlaced video, or one even and one odd fields for interlaced video. If the display time is not completed, processing returns to step 306. Once the display time is completed, the signature generator status is set to "done" as shown in step 309 and the characteristic signature is output to ATE 112. The process steps of the test data generator terminates at END step 310.

Thus, during the testing procedure, test data generator 127 emulates the operation of an external video memory, such as an external video memory 114. In response to signals input from video memory control bus 109, the test data generator will force simulated data onto video memory data bus 111. This data can be cycled by RAS (Row Address Strobe) and/or CAS (Column Address Strobe) signals to emulate the response an external video memory would have to signals generated by the memory controller 116 in actual operation.

Figure 6:
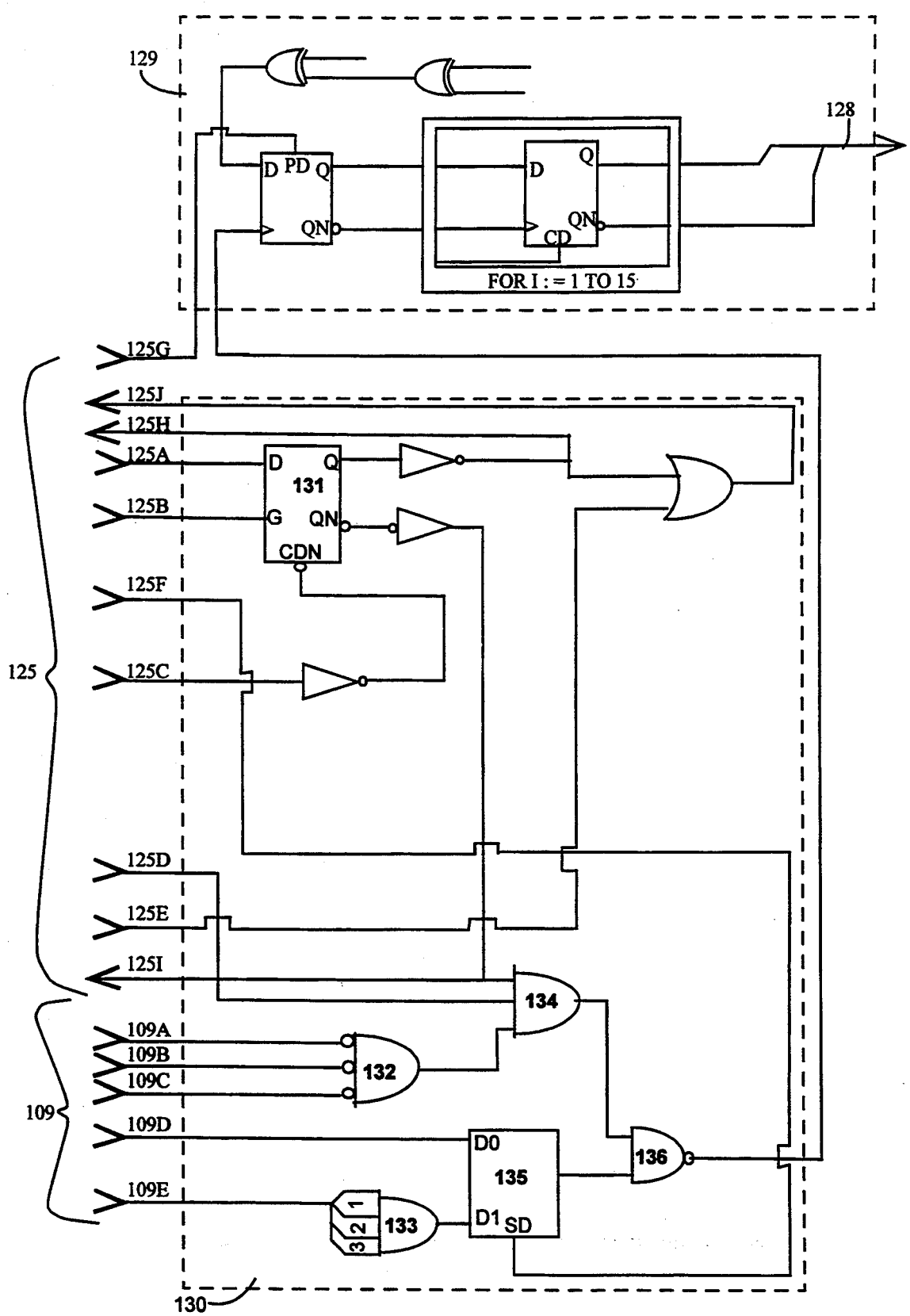
FIG. 6 shows the schematic diagram of the preferred embodiment of test data generator of the present invention.

Referring to FIG. 6, schematic diagrams of control units 129 and 130 are shown in accordance with the preferred embodiment of the present invention. Input signals Oeon 109A, REF 109B, CPU 109C, CASi 109D, and CASj(3:0) 109E are a subset of the video memory control bus 109 discussed above. Input signals LDB(5) 125A, SW(24) 125B, RST 125C, RUNNING 125D, Srn(24) 125E, Cfn(12) 125F, and RSTSR 125G, and output signals GENDATn 125H, GENDAT 125I, and IOD1n(5) 125J are a subset of internal data and control bus 125, as discussed above. Output bus DGEN(31:0) 128 corresponds to the data generator's internal memory data bus 128.

Pseudo-random sequence generator 129 is implemented in a manner well known in the art. Pseudo-random sequence generator 129 is of a type that is resettable so that the pseudo-random sequence it generates can be repeated, and is able to advance from one datum to the next in its sequence quickly enough to mimic the full speed operation of an external video memory 114 in a FIG. 1 type system environment.

The control logic portion 130 of test data generator of FIG. 6 can be constructed from combinational logic circuitry so as to cycle pseudo-random sequence generator 129, as discussed above in conjunction with the RAS and CAS signals. In the preferred embodiment of FIG. 6, only the CAS signals are used to drive pseudo-random signal generator 129.

Control logic 130 controls pseudo-random generator 129 as follows. Block 131 is a latch which is set to logic 1 to enable operation of data generator 128 or set to logic 0 to disable operation of data generator 128. This latch is set during the data generator and signal generator initialization step 202, as shown in FIG. 8, and in step 301 of FIG. 9.

Logic elements 132, 133, 134, 135 and 136 produce the signal CKGEN which causes pseudo-random generator 129 to advance to the next pseudo-random datum which is output as DGEN(31:0) 128. These logic elements perform the function which is described algebraically in block 306 of FIG. 9.

While test data generator 127 can be adapted to mimic any type of external video memory 114, in the preferred embodiment external video memory 114 is a Dynamic Random Access Memory (DRAM). One control aspect of a DRAM is that data read from a DRAM is valid when DRAM output enable 109A of FIG. 6 is active and the Column Address Strobe (CAS) 109D or 109E is active. Some configurations of DRAM use one CAS, such as CASi 109D, while other configurations use multiple CAS signals, such as CASj(3:0) 109E. Logical OR gate 133 combines the multiple CASj(3:0) 109E signals into a combined CAS signal. Multiplexer 135 selects a single CASi signal or the combined CAS signals from logical OR gate 133 depending on the DRAM configuration signal Cfn(12) 125F.

Another behavior peculiar to a DRAM is that it needs to be periodically refreshed. This requirement can be met by accessing the DRAM in the refresh mode. Logic element 132 monitors refresh signal 109B and prevents pseudo-random generator 129 from advancing during the refresh mode accesses. In a similar manner, a host computer (discussed previously in conjunction with FIG. 1) may at any time read data from external video memory 114. Logic element 132 monitors the host computer video memory read signal CPU 109C and prevents pseudo-random signal generator 129 from advancing during host computer video memory read operations.

In the preferred embodiment, signature generator 124 and test data generator 127 both operate over one full frame, or over one odd and even field interlaced video frame. Control logic 130 observes the state of internal data and control bus 125 and video memory control bus 109. When test data generator 127 is enabled, control logic 130 monitors video memory control bus 109 in order to command pseudo-random signal generator 129 to advance to its next datum at the correct time to mimic the behavior of a video memory in a system environment. Control logic 130 is optimized to mimic the behavior of a Dynamic Random Access Memory (DRAM). However, any other type of video memory could be mimicked using some combination of gates in control logic 130.

Thus, the on-board test data generator of the present invention overcomes the problems associated with prior art video controller ICs by allowing for thorough high-speed testing of the video controller IC with the use of a low speed ATE. The test data generator mimics the behavior of an external video memory, but unlike an external ATE, can do so asynchronously and without the inherent delays induced by the ATE. The limitations of the ATE do not prevent the test pattern from accurately reflecting real operating conditions and thus the integrated circuit can now be adequately tested.

Figure 7:
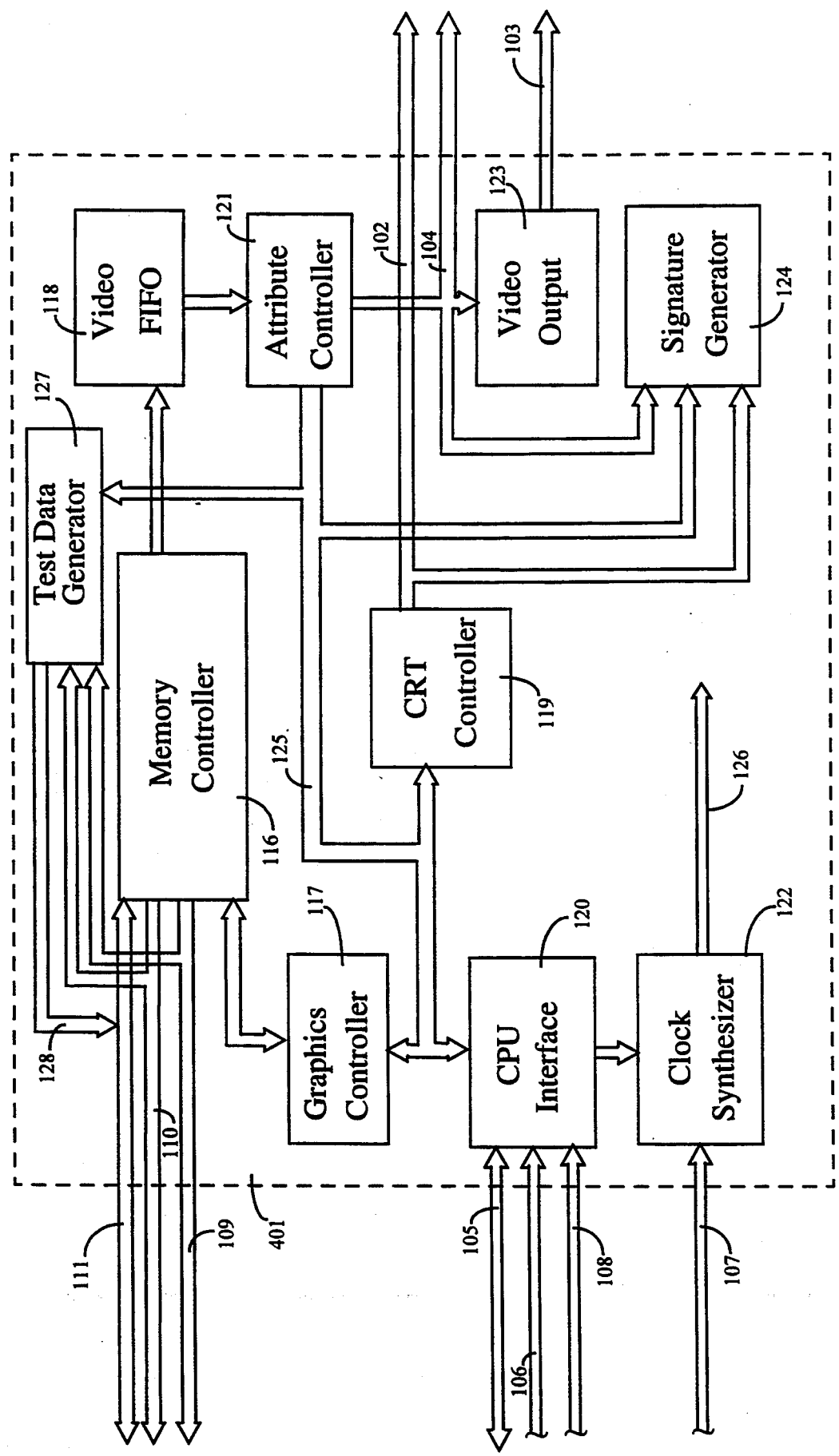
FIG. 7 is a block diagram of a video controller IC, including an alternative embodiment of the present invention.

While a preferred embodiment of the present invention has been disclosed and described in detail herein, it will be obvious to those skilled in the art that various changes in form and detail may be made therein without departing from the spirit and scope thereof. For example, referring to FIG. 7, an alternative implementation of video controller IC 401 is shown wherein the video memory address bus 110 is provided as an additional input to test data generator 127. Signal values from memory address bus 110 are combined with data from pseudo-random signal generator 129, or supplant data from pseudo-random signal generator 129. This alternative embodiment has the additional benefit of testing memory address generation by memory controller 116 at high speed operating conditions.

Furthermore, memory controller 116 can be modified slightly so that test data generator 127 can be used in a normal system environment. The modification to memory controller 116 causes it to withhold or modify some of the signals on video memory control bus 109, so that external video memory 114, shown on FIG. 1, will not attempt to respond to a video memory read operation, and thus will not conflict with video memory data supplied by the test data generator 127. In addition, although test data generator 127 is shown here configured for use within video controller IC 401, it is envisioned that the test data generator 127 could be suitably modified to operate within other types of integrated circuits where high speed testing is desired.

The invention claimed is:

1. A integrated circuit having built-in test capability comprising, on a common semiconductor substrate:
 a host bus for communicating with a host processor;
 memory busses for reading and writing data to and from an external memory;
 a memory controller coupled to said memory busses for generating memory control signals on said memory busses for writing and reading data to and from said memory busses, and outputting data read from said memory busses;
 a test data generator, coupled to said memory busses, for monitoring said memory control signals on said memory busses and selectively supplying test data which emulates memory data on said memory busses for testing circuitry other than memory within said integrated circuit; and
 a signature generator, coupled to said memory controller and said host bus for generating a characteristic signature in response to said data output from said memory controller and supplying said characteristic signature to said host bus.

2. The integrated circuit of claim 1, wherein said signature generator generates a characteristic signature using a cyclic redundancy check.

3. The integrated circuit of claim 1, wherein said memory busses include:
 a memory address bus for sending memory address signals,
 a memory control bus for sending memory control signals, and
 a memory data bus for transmitting and receiving memory data,
 wherein memory address signals are provided as an input to said test data generator, said test data generator outputting said memory address signals as test data.

4. The integrated circuit of claim 1, wherein said test data generator includes:
 a pseudo-random data generator for generating a pseudo-random data stream and providing said pseudo-random data stream as said test data on said memory busses in response to said memory control signals.

5. The integrated circuit of claim 4, wherein said memory busses include:
 a memory address bus for sending memory address signals,
 a memory control bus for sending memory control signals, and
 a memory data bus for transmitting and receiving memory data.

6. The integrated circuit of claim 5, wherein memory address signals are provided as an input to said test data generator and are combined with said pseudo-random data stream output from said pseudo-random data generator as said test data.

7. A video controller integrated circuit having built-in test capability comprising, on a common semiconductor substrate:
 a host bus for communicating with a host processor;
 memory busses for reading and writing data to and from an external memory;
 a video memory controller coupled to said memory busses for generating video memory control signals on said memory busses for writing and reading data to and from said memory busses, and outputting data read from said memory busses;
 a test data generator, coupled to said memory busses, for monitoring said video memory control signals on said memory busses and selectively supplying test data which emulates memory data on said memory busses for testing circuitry other than memory within said video controller integrated circuit; and
 a signature generator, coupled to said memory controller and said host bus for generating a characteristic signature in response to said data output from said memory controller and supplying said characteristic signature to said host bus.

8. The video controller integrated circuit of claim 7, wherein said test data generator includes:
 a pseudo-random data generator for generating a pseudo-random data stream and providing said pseudo-random data stream as said test data on said memory busses in response to said memory control signals.

9. The video controller integrated circuit of claim 8, wherein said memory busses include:
 a memory address bus for sending video memory address signals, a memory control bus for sending video memory control signals, and
 a memory data bus for transmitting and receiving video memory data.

10. The video controller integrated circuit of claim 9, wherein video memory address signals are provided as an input to said test data generator and are combined with said pseudo-random data stream output from said pseudo-random data generator as said test data.

11. The video controller integrated circuit of claim 7, wherein said signature generator generates a characteristic signature using a cyclic redundancy check.

12. The video controller integrated circuit of claim 11, wherein said signature generator generates a characteristic signature by performing a cyclic redundancy check on one entire frame of video data.

13. The video controller integrated circuit of claim 12, wherein said signature generator generates a characteristic signature by performing a cyclic redundancy check on one entire frame of video data comprising even and odd interlaced fields.

14. A method of testing a controller integrated circuit having built-in test capability including, upon a common semiconductor substrate, a test data generator, a memory controller and a signature generator, said method comprising the steps of:

within an external test equipment, generating a first characteristic signature for a predetermined stream of data which emulates memory data for testing circuitry other than memory within said controller integrated circuit and storing said first characteristic signature in a memory of the external test from the external test equipment, supplying a signal to the controller integrated circuit to cause the test data generator thereon to generate the predetermined stream of data which emulates memory data for testing circuitry other than memory within said controller integrated circuit and to transmit the predetermined stream of data to the memory controller;

from said signature generator on the integrated circuit coupled to the memory controller, generating a second characteristic signature in response to the predetermined stream of data and supplying the second characteristic signature to the external test equipment; and in the external test equipment, comparing the first and second characteristic signatures to detect an error within said controller integrated circuit.

15. The method of claim 14, wherein said predetermined stream of data represents one frame of video data.

16. The method of claim 14, wherein said step of generating a second characteristic signature comprises the step of performing a cyclic redundancy check on said predetermined stream of data.

17. A computer system comprising:

a host bus for communicating with a host processor;

a host processor, coupled to said host bus for processing data input to said host processor and outputting data to said host bus, at least some of said data to be displayed on a video display;

a video controller integrated circuit having built-in test capability coupled to said host bus, said video controller integrated circuit comprising, on a common semiconductor substrate:

(a) memory busses for reading and writing data to and from an external memory;

(b) a video memory controller coupled to said memory busses for generating video memory control signals on said memory busses for writing and reading data to and from said memory busses, and outputting data read from said memory busses;

(c) a test data generator, coupled to said memory busses, for monitoring said video memory control signals on said memory busses and selectively supplying test data which emulates video memory data on said memory busses for testing circuitry other than memory within said video controller integrated circuit; and (d) a signature generator, coupled to said video memory controller and said host bus for generating a characteristic signature in response to said data output from said video memory controller and supplying said characteristic signature to said host bus, and a video display, coupled to said video controller integrated circuit, for receiving video data signals from said video controller integrated circuit and generating a video display therefrom.

18. The computer system of claim 17, wherein said test data generator includes a pseudo-random data generator for generating a pseudo-random data stream and providing said pseudo-random data stream as said test data on said memory busses in response to said memory control signals.

19. The computer system of claim 18, wherein said memory busses include:

a memory address bus for sending video memory address signals, a memory control bus for sending video memory control signals, and a memory data bus for transmitting and receiving video memory data, wherein video memory address signals are provided as an input to said test data generator and are combined with said pseudo-random data stream output from said pseudo-random data generator as said test data.

20. The computer system of claim 17, wherein said signature generator generates a characteristic signature using a cyclic redundancy check.

21. The computer of claim 20, wherein said signature generator generates a characteristic signature by performing a cyclic redundancy check on one entire frame of video data.

22. The computer of claim 21, wherein said signature generator generates a characteristic signature by performing a cyclic redundancy check on one entire frame of video data comprising even and odd interlaced fields.

23. A system for testing a video controller integrated circuit having built-in test capability, comprising:

a test bus for communicating data to and from said video controller integrated circuit;

an automated test equipment, coupled to said test bus, for sending and receiving data to and from said video controller integrated circuit; and a video controller integrated circuit coupled to said test bus, wherein said video controller integrated circuit comprises, on a common semiconductor substrate:

(a) memory busses for reading and writing data to and from an external memory;

(b) a video memory controller coupled to said memory busses for generating video memory control signals on said memory busses for writing and reading data to and from said memory busses, and outputting data read from said memory busses;

(c) a test data generator, coupled to said memory busses, for monitoring said video memory control signals on said memory busses and selectively supplying test data which emulates video memory data on said memory busses for testing circuitry other than memory within said video controller integrated circuit; and (d) a signature generator, coupled to said video memory controller and said host bus for generating a characteristic signature in response to said data output from said video memory controller and supplying said characteristic signature to said host bus.

24. The system of claim 23, wherein said test data generator includes:

a pseudo-random data generator for generating a pseudo-random data stream and providing said pseudo-random data stream as said test data on said memory busses in response to said memory control signals.

25. The system of claim 24, wherein said memory busses include:

a memory address bus for sending video memory address signals, a memory control bus for sending video memory control signals, and a memory data bus for transmitting and receiving video memory data, wherein video memory address signals are provided as an input to said test data generator and are combined with said pseudo-random data stream output from said pseudo-random data generator as said test data.

26. The system of claim 23, wherein said signature generator generates a characteristic signature using a cyclic redundancy check.

27. The system of claim 26, wherein said signature generator generates a characteristic signature by performing a cyclic redundancy check on one entire frame of video data.

28. The system of claim 27, wherein said signature generator generates a characteristic signature by performing a cyclic redundancy check on one entire frame of video data comprising even and odd interlaced fields.

* * * * *